United States Patent
Lin et al.

(10) Patent No.: US 6,322,057 B1
(45) Date of Patent: Nov. 27, 2001

(54) AUXILIARY GASLINE-HEATING UNIT IN CHEMICAL VAPOR DEPOSITION

(75) Inventors: Juen-Kuen Lin, Kaohsiung; Chien-Hsin Lai, Kaohsiung Hsien; Peng-Yih Peng, Hsinchu Hsien; Fu-Yang Yu, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/577,068

(22) Filed: May 22, 2000

(51) Int. Cl.[7] .......................................... B01F 3/04
(52) U.S. Cl. ........................... 261/127; 261/131; 261/142
(58) Field of Search ............................ 261/127, 128, 261/129, 130, 131, 142, DIG. 31, DIG. 65

(56) References Cited

U.S. PATENT DOCUMENTS

| | | | |
|---|---|---|---|
| 4,220,460 | * 9/1980 | Partus | 261/142 |
| 4,276,243 | * 6/1981 | Partus | 261/131 |
| 4,436,674 | * 3/1984 | McMenamin | 261/128 |
| 4,861,524 | * 8/1989 | Sielaff et al. | 261/130 |
| 5,372,754 | * 12/1994 | Ono | 261/142 |
| 5,733,375 | * 3/1998 | Fukuda et al. | 261/131 |
| 6,179,277 | * 1/2001 | Huston et al. | 261/128 |
| 6,244,575 | * 6/2001 | Vaartstra et al. | 261/142 |

* cited by examiner

Primary Examiner—C. Scott Bushey
(74) Attorney, Agent, or Firm—Jiawei Huang; J.C. Patents

(57) ABSTRACT

An auxiliary gasline-heating unit is used in a chemical vapor deposition apparatus. The auxiliary gasline-heating unit serves to increase the exit temperature of the mixture of $N_2$ gas and He-dilute gas in order to prevent TDMAT, $Ti[N(CH_3)_2]_4$, from being condensed and becoming a gasline contaminant when the mixture mixes with the TDMAT and a carrier gas.

2 Claims, 3 Drawing Sheets

AUXILIARY GASLINE-HEATING UNIT IN CHEMICAL VAPOR DEPOSITION

BACKGROUND OF THE INVENTION

1. Field of the Invention

The present invention relates to an auxiliary gasline-heating unit. More particularly, the present invention relates to an auxiliary gasline-heating unit employed in a chemical vapor deposition apparatus.

2. Description of the Related Art

In a conventional chemical vapor deposition apparatus, gases, comprising a He (helium) carrier gas, a $N_2$ (nitrogen) gas, a He-dilute gas, and a $Ti[N(CH_3)_2]_4$ (TDMAT) vapor, are delivered by a gasline system comprising a TDMAT ampule 10, a He carrier gasline 12 connected to the TDMAT ampule 10, and a mixture gasline 14 connected to the TDMAT ampule shown as in FIG. 1. The mixture gasline 14 further comprises a $N_2$ gasline 16 and a He-dilute gasline 18. The flow rate of the $N_2$ gas and the He-dilute gas can be controlled by the mass flow controller 2 (MFC 2) and the mass flow controller 3 (MFC 3), respectively, and the flow rate of the He carrier gas can be controlled by the mass flow controller 1 (MFC1). Thus, the TDMAT vapor carried by the He carrier gas mixes with the $N_2$ gas and the He-dilute gas through the gasline system after the He carrier gas passes through the TDMAT ampule 10.

However, in general, the exit temperature of the mixture of the $N_2$ gas and the He-dilute gas is about 25° C., and the temperature of the TDMAT vapor carried by the He carrier gas is about 50° C.; thus, when the TDMAT vapor, the $N_2$ gas and the He-dilute gas are mixed together, the temperature of the mixture is lowered from 50° C. to about 32° C. As a result, the TDMAT vapor is condensed in the vicinity of a valve PV 8. The condensed TDMAT can pollute the gasline system.

SUMMARY OF THE INVENTION

According to the above, the invention provides an auxiliary gasline-heating unit to prevent the TDMAT vapor from condensing in the gasline system of a chemical vapor deposition apparatus.

According to the invention, a gasline system provided for delivering gases for chemical vapor deposition comprises a $Ti[N(CH_3)_2]_4$ ampule, a carrier gasline connected to the $Ti[N(CH_3)_2]_4$ ampule, and a mixture gasline consisting of a nitrogen ($N_2$) gasline and a helium(He)-dilute gasline. The mixture gasline connects to the $Ti[N(CH_3)_2]_4$ ampule in order to mix the carrier gas and the $Ti[N(CH_3)_2]_4$ with the mixed gas comprising the nitrogen gas and the helium-dilute gas. The improvement in this system comprises either placing an auxiliary gasline-heating unit on an exit of the mixed gas to increase an exit temperature of the mixed gas, or placing auxiliary gasline-heating units on the nitrogen gasline and on the helium-dilute gasline to increase exit temperatures of the nitrogen gas and the helium-dilute gas, respectively.

Thus, the exit temperature of the mixture of the nitrogen gas and the helium-dilute gas is increased; as a result, the temperature when the TDMAT vapor mixes with the nitrogen gas and the helium-dilute gas is increased. That is, the invention can prevent the TDMAT vapor from being condensed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

In order to increase the mixture temperature of a TDMAT vapor, a $N_2$ gas and a He-dilute gas in a chemical vapor deposition process, the invention provides an auxiliary gasline-heating unit on the gasline system of the chemical vapor deposition apparatus.

Embodiment I

Figure 1:
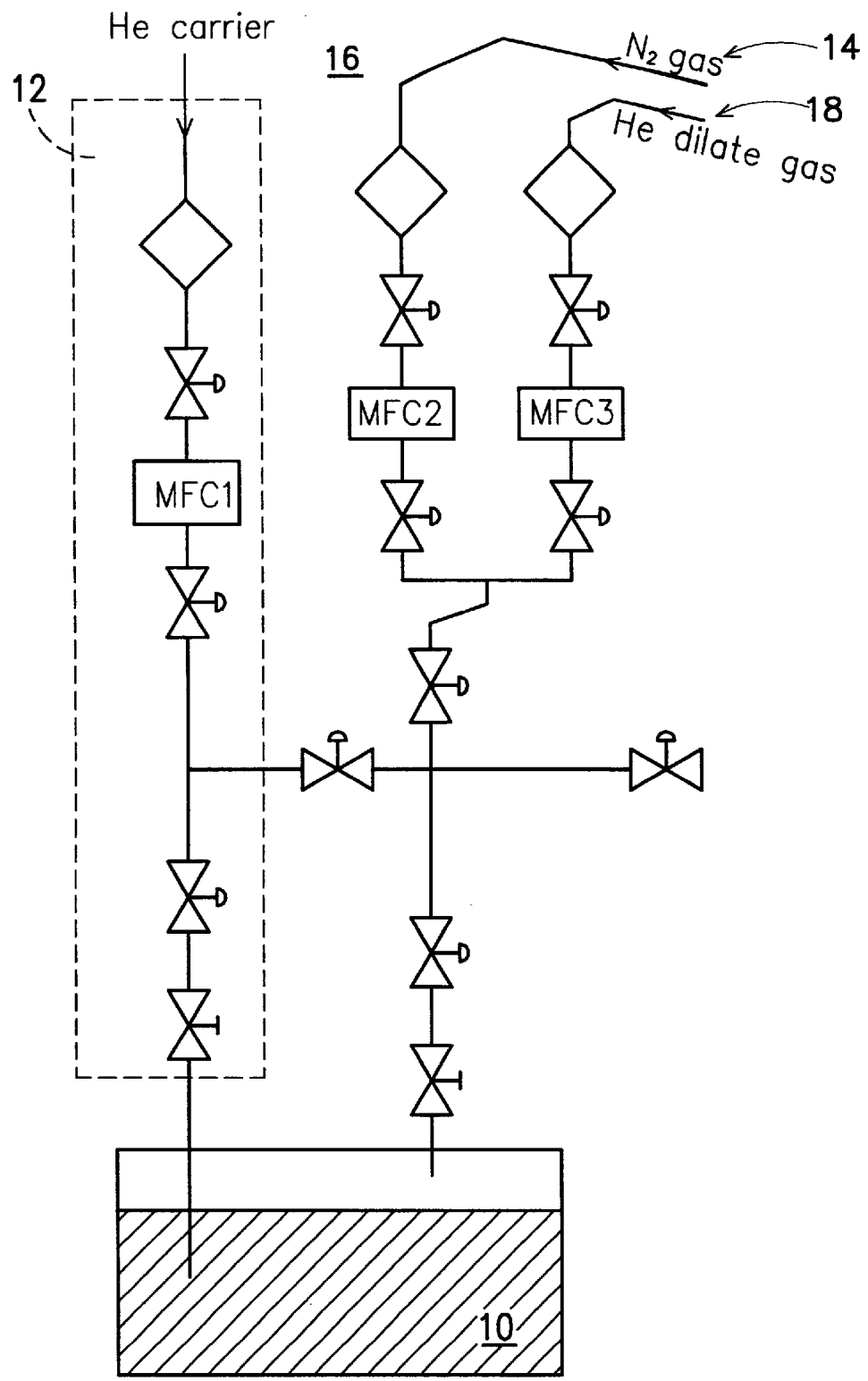
FIG. 1 is a schematic view showing a gasline system according to the prior art in a chemical vapor deposition apparatus.
Figure 2:
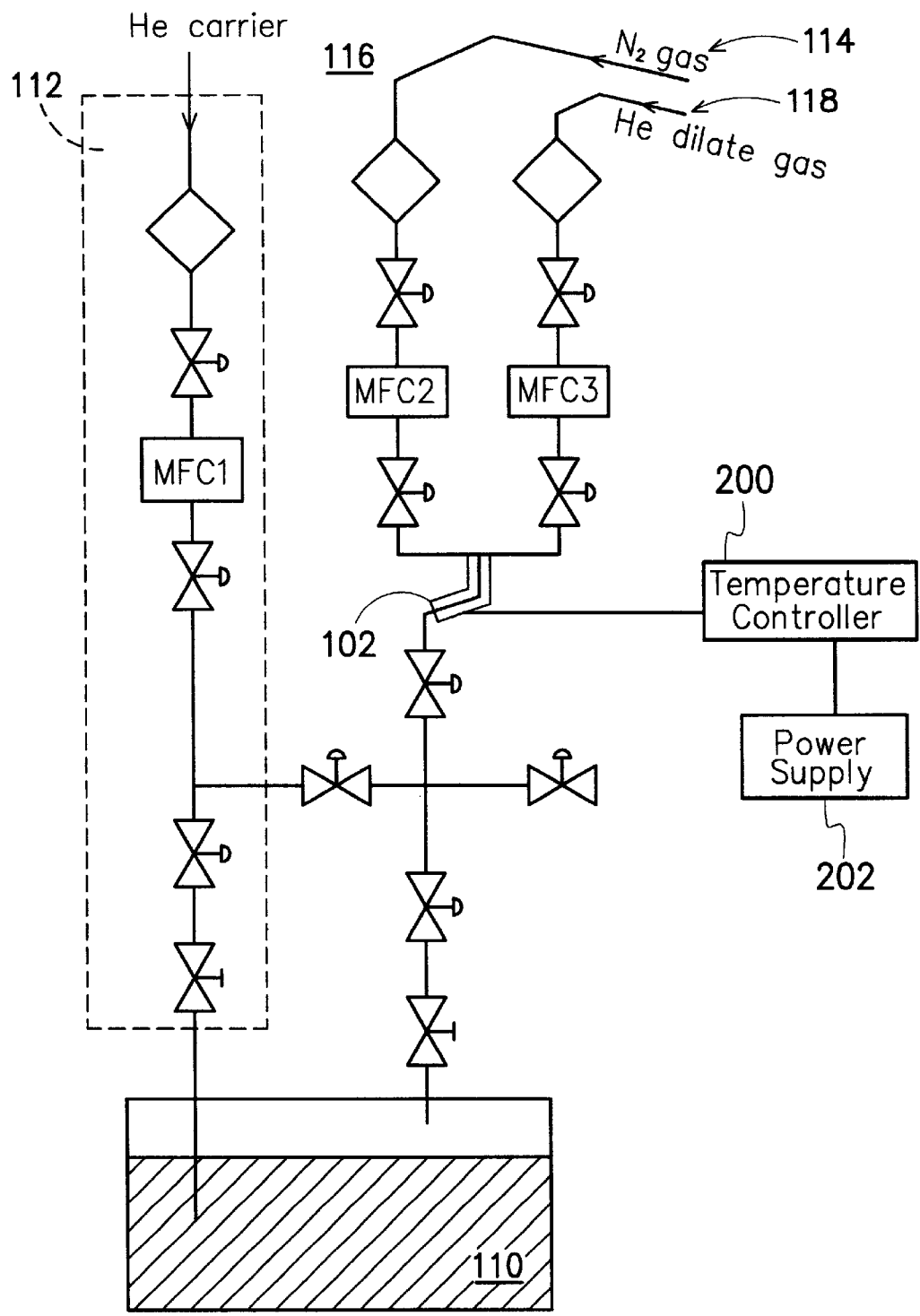
FIG. 2 is a schematic view showing a gasline system with an auxiliary gasline-heating unit located on the exit of the mixture of the nitrogen gas and the helium-dilute gas, according to a first preferred embodiment of the invention, in a chemical vapor deposition apparatus.

FIG. 2 is a schematic view showing a gasline system according to a first preferred embodiment of the invention, with an auxiliary gasline-heating unit located on the exit of the mixture of the nitrogen gas and the helium-dilute gas in a chemical vapor deposition apparatus.

Referring to FIG. 2, a gasline system delivers gases for chemical vapor deposition. The gases comprise a He (helium) carrier gas, a $N_2$ (nitrogen) gas, a He-dilute gas, and a $Ti[N(CH_3)_2]_4$ (TDMAT) vapor. The gasline system comprises a $Ti[N(CH_3)_2]_4$ ampule 110, a carrier gasline 112 connected to the $Ti[N(CH_3)_2]_4$ ampule 110, and a mixture gasline 114 consisting of a nitrogen gasline 116 and a helium-dilute gasline 118. The mixture gasline 114 is connected to the $Ti[N(CH_3)_2]_4$ ampule 110 in order to mix the He carrier gas and the $Ti[N(CH_3)_2]_4$ vapor with the mixed gas comprising the nitrogen gas and the helium-dilute gas. The improvement comprises an auxiliary gasline-heating unit located on an exit of the mixed gas for the purpose of increasing an exit temperature of the mixed gas. The auxiliary gasline-heating unit comprises a heater tape 102 on the mixture gasline to heat the mixture gasline, a temperature controller 200 connected to the heater tape 102 to control a temperature of the heater tape 102, and a power supply 202 connected to the temperature controller 200 to supply a heating power.

When the $N_2$ gas and the He-dilute gas pass through the $N_2$ gasline 116 and the He-dilute gasline 118, respectively, and mix together, the mixture of the $N_2$ gas and the He-dilute gas is subsequently heated to about 50–80° C. by the auxiliary gasline-heating unit located on the exit of the mixture of the $N_2$ gas and the He-dilute gas. According to the prior art, the mixture of $N_2$ gas and He-dilute gas further mixes with the TDMAT vapor carried by the He carrier gas through the carrier gasline 112. However, the TDMAT vapor in the mixture is not condensed because the exit temperature of the mixture of the $N_2$ gas and the He-dilute gas in the invention is higher than in the prior art. Thus, the problem of the TDMAT vapor condensing as seen in the prior art can be solved.

Embodiment II

Figure 3:
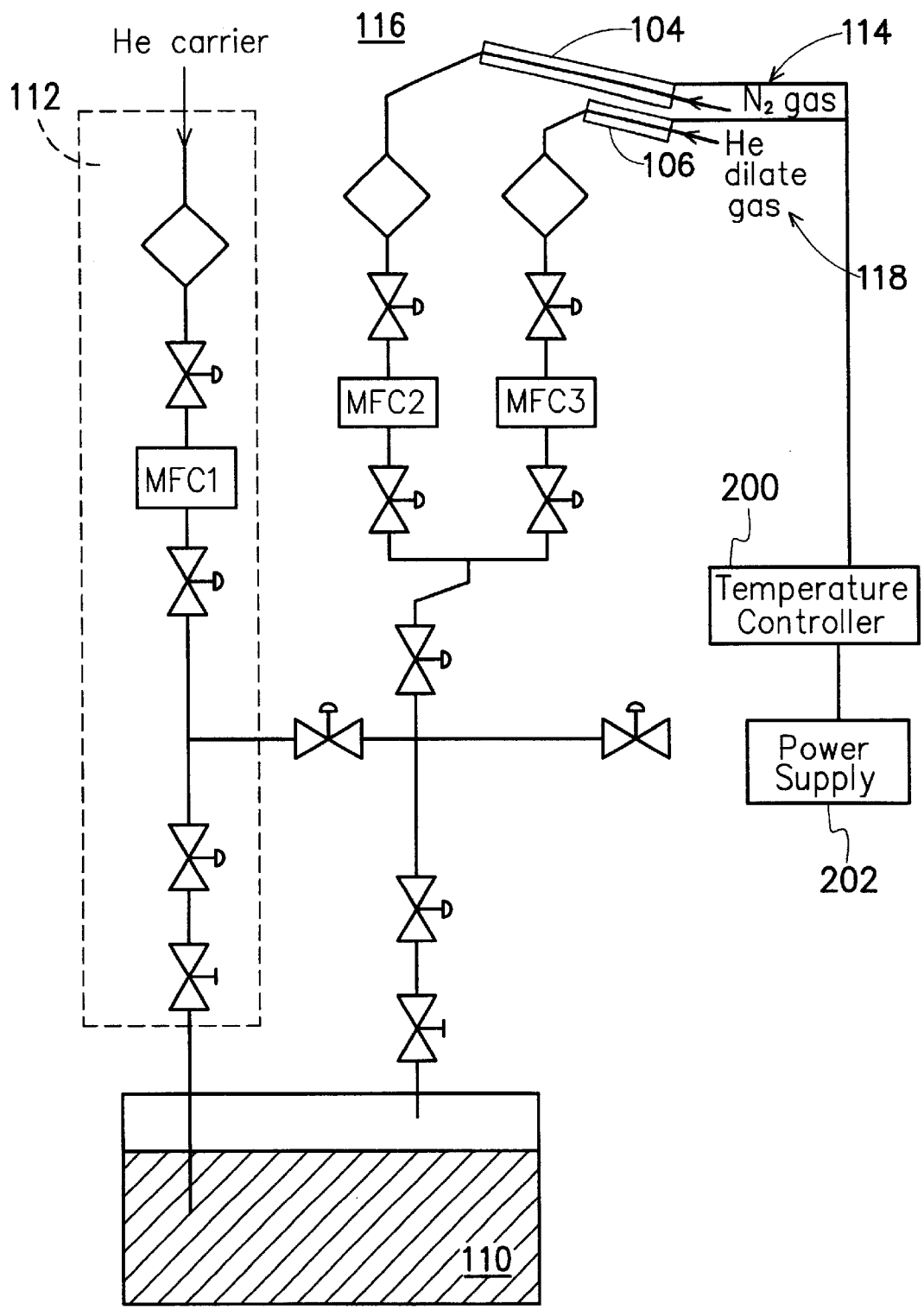
FIG. 3 is a schematic view showing a gasline system with auxiliary gasline-heating units located on the nitrogen gasline and the helium-dilute gasline, respectively, according to a second preferred embodiment of the invention, in a chemical vapor deposition apparatus.

FIG. 3 is a schematic view showing a gasline system according to a second preferred embodiment of the invention, with auxiliary gasline-heating units located on the nitrogen gasline and the helium-dilute gasline, respectively, in a chemical vapor deposition apparatus.

Referring to FIG. 3, a gasline system delivers gases for chemical vapor deposition. The gases comprise a He (helium) carrier gas, a $N_2$ (nitrogen) gas, a He-dilute gas, and a $Ti[N(CH_3)_2]_4$ (TDMAT) vapor. The gasline system comprises a $Ti[N(CH_3)_2]_4$ ampule 110, a carrier gasline 112 connected to the $Ti[N(CH_3)_2]_4$ ampule 110, and a mixture gasline 114 consisting of a nitrogen gasline 116 and a helium-dilute gasline 118. The mixture gasline 114 is connected to the $Ti[N(CH_3)_2]_4$ ampule 110 in order to mix the He carrier gas and the $Ti[N(CH_3)_2]_4$ vapor with the mixed gas comprising the nitrogen gas and the helium-dilute gas. The improvement comprises auxiliary gasline-heating units located on the nitrogen gasline 116 and the helium-dilute gasline 118 to increase the temperatures of the nitrogen gas and the helium-dilute gas. The auxiliary gasline-heating units further comprise two heater tapes 104 and 106, a temperature controller connected to the two heater tapes to control temperatures of the two heater tapes 104 and 106, and a power supply 202 connected to the temperature controller 200 to supply a heating power.

Before the $N_2$ gas and the He-dilute gas pass through the $N_2$ gasline 116 and the He-dilute gasline 118, the $N_2$ gas and the He-dilute gas are heated to about 50–80° C. by the auxiliary gasline-heating units on the $N_2$ gasline 116 and the He-dilute gasline 118, respectively. Then, the $N_2$ gas and the He-dilute gas are mixed together into a mixture having a temperature of about 50–80° C. The mixture of the $N_2$ gas and the He-dilute gas further mixes with the TDMAT vapor carried by the He carrier gas through the carrier gasline 112. However, the TDMAT vapor in the mixture is not condensed because the exit temperature of the mixture of the $N_2$ gas and the He-dilute gas in the invention is higher than in the prior art.

Thus, according to the second embodiment of the invention, the problem of the TDMAT vapor condensing as seen in the prior art can be solved.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A gasline system for delivering gases for chemical vapor deposition, the system comprising a $Ti[N(CH_3)_2]_4$ ampule, a carrier gasline connected to the $Ti[N(CH_3)_2]_4$ ampule, and a mixture gasline consisting of a nitrogen gasline and a helium-dilute gasline, wherein the mixture gasline is connected to the $Ti[N(CH_3)_2]_4$ ampule in order to mix a carrier gas and the $Ti[N(CH_3)_2]_4$ with a mixed gas comprising nitrogen gas and helium-dilute gas, an improvement to which system comprises an auxiliary gasline-heating unit located on an exit of the mixed gas comprising the nitrogen gas and the helium-dilute gas for increasing an exit temperature of the mixed gas comprising the nitrogen gas and the helium-dilute gas, wherein the auxiliary gasline-heating unit further comprises:

a heater tape located on the mixture gasline for heating the mixture gasline;

a temperature controller connected to the heater tape for controlling a temperature of the heater tape; and a power supply connected to the temperature controller for supplying a heating power.

2. The auxiliary gasline-heating unit of claim 1, wherein the temperature of the heater tape is about 50–80° C.

* * * * *